(12) United States Patent
Jin et al.

(10) Patent No.: US 11,949,351 B2
(45) Date of Patent: Apr. 2, 2024

(54) LINEAR COMB DRIVER WITH NON-UNIFORM FINGERS FOR ALIGNMENT STABILITY AT DISCRETE POSITIONS

(71) Applicant: Lumentum Operations LLC, San Jose, CA (US)

(72) Inventors: Wenlin Jin, Ottawa (CA); Gonzalo Wills, Ottawa (CA)

(73) Assignee: Lumentum Operations LLC, San Jose, CA (US)

( * ) Notice: Subject to any disclaimer, the term of this patent is extended or adjusted under 35 U.S.C. 154(b) by 531 days.

(21) Appl. No.: 16/913,907

(22) Filed: Jun. 26, 2020

(65) Prior Publication Data

US 2021/0242807 A1   Aug. 5, 2021

Related U.S. Application Data

(60) Provisional application No. 62/967,854, filed on Jan. 30, 2020.

(51) Int. Cl.
*G03G 15/20* (2006.01)
*G02B 7/182* (2021.01)
*H02N 1/00* (2006.01)

(52) U.S. Cl.
CPC ............. *H02N 1/008* (2013.01); *G02B 7/182* (2013.01)

(58) Field of Classification Search
USPC ........................................................ 310/309
See application file for complete search history.

(56) References Cited

U.S. PATENT DOCUMENTS

| 2008/0316577 | A1* | 12/2008 | Moidu | B81B 3/004 359/291 |
| 2011/0050251 | A1* | 3/2011 | Franke | B81B 3/0094 324/658 |
| 2021/0140816 | A1* | 5/2021 | Hsu | B81B 3/0054 |
| 2021/0239966 | A1* | 8/2021 | Jin | B81B 3/0062 |

FOREIGN PATENT DOCUMENTS

| CN | 110012411 B * | 1/2021 | ............... H04R 1/02 |
| WO | WO-2016121214 A1 * | 8/2016 | ........... B81B 3/0016 |

OTHER PUBLICATIONS

CN 110012411A computer translation (Year: 2019).*
WO2016/121214 computer translation (Year: 2016).*
Isabelle Pacheco Fernandes Harouche, "Simulation of Shaped Comb Actuator for Controlled Displacement Applications", https://mspace.lib.umanitoba.ca/bitstream/handle/1993/20164/Harouche_Simulation_of.pdf?sequence=1, Nov. 2004, 120 pages.
Jejmule, "Comb-drive vibrating in-plane measured by digital holographic microscope", https://en.wikipedia.org/wiki/Comb_drive#/media/File:Comb-drive-digital-holographic-Microscopy-Holographic-MEMS-Analyzer.gif, Feb. 2, 2017, 2 pages.

(Continued)

*Primary Examiner* — Quana Grainger
(74) *Attorney, Agent, or Firm* — Harrity & Harrity, LLP (57) ABSTRACT

A linear comb drive may include a stator. The linear comb drive may include a rotor. At least one of the stator or the rotor may include a comb with one or more horizontally-extending fingers that have a tooth-shape formed by one or more prongs that extend vertically from the one or more fingers in a plane formed by the one or more fingers.

19 Claims, 10 Drawing Sheets

(56) References Cited

OTHER PUBLICATIONS

Isabelle P.F. Harouche et al., "Comb Drive", https://lost-contact.mit.edu/afs/nada.kth.se/amdlinks/pkg/femlab/3.1x/doc/memsmodlib/memsactuatormodels3.htm, 12 pages.
Wikipedia, "Comb drive", https://en.wikipedia.org/wiki/Comb_drive, Jun. 5, 2020, 2 pages.
Science Direct, "Comb Drive Actuator", https://www.sciencedirect.com/topics/engineering/comb-drive-actuator/pdf, Feb. 4, 2012, 8 pages.

* cited by examiner

LINEAR COMB DRIVER WITH NON-UNIFORM FINGERS FOR ALIGNMENT STABILITY AT DISCRETE POSITIONS

RELATED APPLICATION(S)

This application claims priority to U.S. Provisional Patent Application No. 62/967,854, filed on Jan. 30, 2020, and entitled "LINEAR COMB DRIVER WITH IMPROVED STABILITY AT DRIVING RANGES," the content of which is incorporated by reference herein in its entirety.

TECHNICAL FIELD

The present disclosure relates generally to microelectromechanical systems and to linear comb drivers.

BACKGROUND

A linear comb driver is a microelectromechanical system (MEMS) actuator that uses electrostatic forces for actuation. A linear comb driver includes a rotor, which includes a first electrically conductive comb, and a stator, which includes a second electrically conductive comb. Based at least in part on applying an electrostatic force to the first and second electrically conductive combs, the linear comb driver moves the rotor relative to the stator, which may be static. Linear comb drivers may be used for micro or nano-scale control of other MEMS elements, such as MEMS optical elements in compact optical systems. For example, an optical switching device may include a linear comb driver to actuate a mirror, such that the mirror is capable of aligning to different ports of the optical switching device. In such cases, by actuating the mirror to discrete positions, the linear comb driver enables variable switching in the optical switching device.

SUMMARY

According to some possible implementations, a linear comb drive may include a stator. The linear comb drive may include a rotor. At least one of the stator or the rotor may include a comb with one or more horizontally-extending fingers that have a tooth-shape formed by one or more prongs that extend vertically from the one or more fingers in a plane formed by the one or more fingers.

According to some possible implementations, a comb driver finger assembly may include a base element, a finger element attached to the base element and extending in a first direction, and at least one prong element attached to the finger element and extending in a plane of the finger element and in a second direction perpendicular to the first direction.

According to some possible implementations, a micro-electro-mechanical device may include a stator comb including a first one or more fingers, wherein at least one of the first one or more fingers is associated with a first tooth-shape formed by a first one or more prongs, and wherein the first one or more prongs extend from the first one or more fingers in a first plane formed by the first one or more fingers. The micro-electro-mechanical device may include a rotor comb including a second one or more fingers, wherein at least one of the second one or more fingers is associated with a second tooth-shape formed by a second one or more prongs, wherein the second one or more prongs extend from the second one or more fingers in a second plane formed by the second one or more fingers, and wherein the first one or more fingers are configured to interleave with the second one or more fingers. The micro-electro-mechanical device may include a movable element mounted to the rotor comb.

DETAILED DESCRIPTION

The following detailed description of example implementations refers to the accompanying drawings. The same reference numbers in different drawings may identify the same or similar elements.

As described above, in some systems it may be desirable to actuate an element attached to a linear comb drive to a set of discrete positions rather than to a continuous range of positions. In some systems, it may be desirable to actuate an element attached to a linear comb drive with greater precision, accuracy and/or stability for a set of discrete positions in a continuous range of positions rather than to actuate the element with roughly the same precision, accuracy and/or stability to any position within the continuous range. For example, when a linear comb drive is attached to a mirror in an optical switching device, the linear comb drive may actuate the mirror to alignment with different ports. Alignment with each port may represent a different discrete position of the linear comb drive (e.g., a discrete position of a rotor relative to a stator). In such an example, when the linear comb drive is actuated to positions between one or more discrete positions of alignment to the different ports, the optical switching device may fail to accurately propagate one or more beams.

In other words, at discrete alignment positions of the linear comb drive (e.g., positions corresponding to optical port alignments), the optical switching device may align an optical path (e.g., switch a beam) from, for example, one or more inputs to, for example, one or more outputs. In contrast, at positions other than the discrete alignment positions, the optical switching device may intentionally not align an optical path between two ports (e.g., drop a beam) by directing a beam from, for example, an input to, for example, an arbitrary space. The precision, accuracy, and stability desired to intentionally align ports is far greater than the precision, accuracy and/or stability desired to intentionally misalign ports. Alternatively, the discrete alignment positions may include positions to drop beam (e.g., sinks, dump ports, and/or the like) and thus precision, accuracy and/or stability at positions other than the discrete alignment positions may be of low relevance.

Stability of the linear comb drive, which may be defined as an ability of the linear comb drive to accurately actuate to a particular position and/or maintain an alignment of an attached moveable element (e.g., in the case of the optical switching device, for example, a mirror) at the particular position may be important to ensuring that a system in which the linear comb drive is used operates effectively. Movement of a linear comb drive may be modeled based on an equation of the form:

$$K \cdot x - \frac{1}{2} \frac{dC}{dx} \cdot V^2 = 0 \quad (1)$$

where K represents a mechanical stiffness of the linear comb drive, x represents a displacement, C represents a capacitance between a movable comb of a rotor and a stationary comb of a stator, and V represents a driving voltage. In terms of resistance to a mechanical disturbance (e.g., a perturbation of displacement, $\delta x$, resulting from, for example, vibration, shock, and/or the like), a response force may be modeled based on an equation of the form:

$$\delta F = K \cdot \delta x - \frac{1}{2} \frac{d^2 C}{dx^2} \cdot \delta x \cdot V^2 \quad (2)$$

where $\delta F$ is a resistance to mechanical disturbance. Stability may be based on a ratio of the response force and the mechanical disturbance, resulting in an equation of the form:

$$S_m = K - \frac{1}{2} \frac{d^2 C}{dx^2} \cdot V^2 \quad (3)$$

where $S_m$ represents a mechanical stability dependent on mechanical stiffness and comb design. A relative stability number based on mechanical stiffness is defined by an equation of the form:

$$N_m = S_m / K = 1 - \frac{d^2 C}{dx^2} / \left( \frac{dC}{dx} \frac{1}{x} \right) \quad (4)$$

where $S_m$ is the relative stability number. A relative stability number less than 1 indicates that actuation of a linear comb drive results in a loss of stability of the linear comb drive. In contrast, a relative stability number greater than 1 indicates that a linear comb drive is more stable as a result of comb actuation. Accordingly, larger numbers indicate greater stability of the linear comb drive.

As the linear comb drive is subject to an electrostatic force from an applied voltage or electric field, overall stability of the linear comb drive is based not only on mechanical stability, but also on electrical stability. For example, based on a voltage perturbation $\delta V$, electrical stability may take the form:

$$\delta x = \frac{1}{2} \frac{dC}{dx} \cdot \frac{1}{K} \cdot \left[ (V + \delta V)^2 - V^2 \right] \approx \frac{dC}{dx} \cdot \frac{1}{K} \delta V \quad (5)$$

$$S_e = \frac{\delta V}{\delta x} = K / \frac{dC}{dx} \quad (6)$$

Again, a larger electrical stability, $S_e$, results in a higher level of stability of the linear comb drive. Accordingly, to increase overall stability of the linear comb drive, a higher comb stiffness and/or improved driving circuitry stability may be used. However, achieving a higher comb stiffness may require a larger comb, which may increase costs and/or prevent utilization in micro- or nano-scale systems, such as optical devices. Furthermore, using driving circuitry with a higher level of stability may further increase costs and/or limit a choice of components that may be used. Furthermore, for linear comb drives that are to actuate to a discrete set of positions, as described above, increasing stability at the discrete set of positions may be more useful than increasing overall stability of the comb drive.

Some aspects described herein use a tooth-shape comb finger in a linear comb drive to achieve higher levels of stability at discrete positions. For example, a linear comb drive may include comb fingers in a rotor and in a stator that have prongs to form a tooth-shape. In this case, prongs may form peaks of the tooth-shape and spaces between the prongs may form valleys that are adjacent to the peaks. When actuated, the linear comb drive may achieve higher levels of stability at positions where the prongs of the rotor and of the stator are in alignment (e.g., when peaks of the rotor line up with peaks of the stator and valleys of the rotor line up with valleys of the stator) than may be achieved at positions of non-alignment (or lack of alignment) and/or than may be achieved using similar material construction in other linear comb drives with uniform comb fingers.

Figure 1:
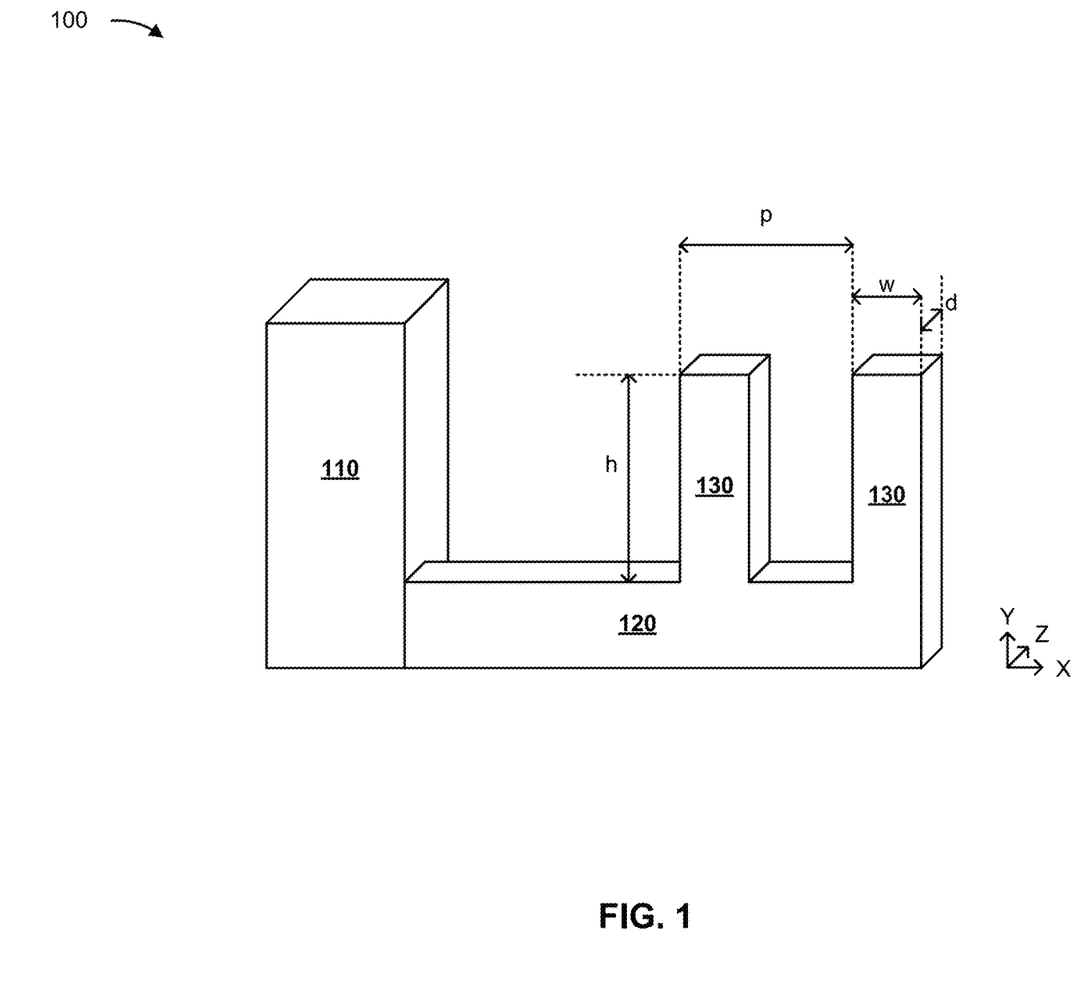
FIG. 1 is a diagram of an example comb finger described herein.

FIG. 1 is a diagram of an example comb finger 100. As shown in FIG. 1, comb finger 100 includes a base element 110, a finger element 120, and a set of prong elements 130.

As further shown in FIG. 1, finger element 120 may extend in a first direction that is perpendicular to a first plane. For example, finger element 120 extends from base element 110 in the X direction, which is perpendicular to the YZ plane. Further, prong elements 130 extend in a second direction that is perpendicular to a second plane, which is orthogonal to the first plane. For example, prong elements 130 extend in the Y direction, which is perpendicular to the XZ plane. In some implementations, prong elements 130 may form a particular profile shape (e.g., the prong elements 130 extend in a plane of the finger 120). For example, in a third plane (e.g., the XY plane), prong elements 130 may form a rectangular shape. Although some aspects are described herein in terms of a rectangular shape or profile, other profile shapes are contemplated, as described in more detail herein. Moreover, although some aspects are described in terms of shape or profile in the XY plane, a shape or profile in other planes may be rectangular or non-rectangular to achieve a particular level of stability at a particular position.

As further shown in FIG. 1, prong elements 130 may be associated with a particular height, h. For example, a linear comb drive may include prong elements 130 with a height of, for example, 5 micrometers (μm) (e.g., for a silicon-waveguide switch). Other heights may be possible for other applications. In some implementations, prong elements 130 may have a width, w, of approximately 1 μm. Additionally, or alternatively, prong elements 130 may have a depth, d, of approximately 1 μm. In some implementations, as shown, comb finger 100 may have multiple prong elements 130. For example, comb finger 100 may have a first prong element 130 disposed at a first distance along finger element 120 and a second prong element 130 disposed at a second distance along finger element 120 (and separated from the first prong element 130 by a threshold distance). In this case, the prong elements 130 may be separated by a pitch, p, of approximately 1.5 μm. Although some implementations are described herein in terms of a particular set of dimensions or range of dimensions, other sets or ranges of dimensions are possible.

In some implementations, each prong element 130 on a comb finger 100 may have the same height. Additionally, or alternatively, a first prong element 130 on a comb finger 100 may have a first height and a second prong element 130 on a comb finger 100 may have a second height. Additionally, or alternatively, a first prong element 130 on a first comb finger of a linear comb driver may have a first height and a second prong element 130 on a second comb finger 100 of the linear comb drive may have a second height. Similarly, prong elements 130 may have the same or different widths, the same or different depths, and/or the like. Similarly, sets of prong elements 130 may have the same or different pitches. Similarly, comb fingers 100 may have a common quantity of prong elements 130 (e.g., the same quantity) or different quantities of prong elements 130. In these cases, a configuration of one or more prong elements 130 (e.g., a height, width, depth, pitch, shape, and/or the like) may be selected based at least in part on a set of alignment positions that a linear comb drive is to align to, a stability requirement for the linear comb drive, and/or the like.

As indicated above, FIG. 1 is provided as an example. Other examples may differ from what is described with regard to FIG. 1. The number and arrangement of devices or components shown in FIG. 1 are provided as an example.

Figure 2A:
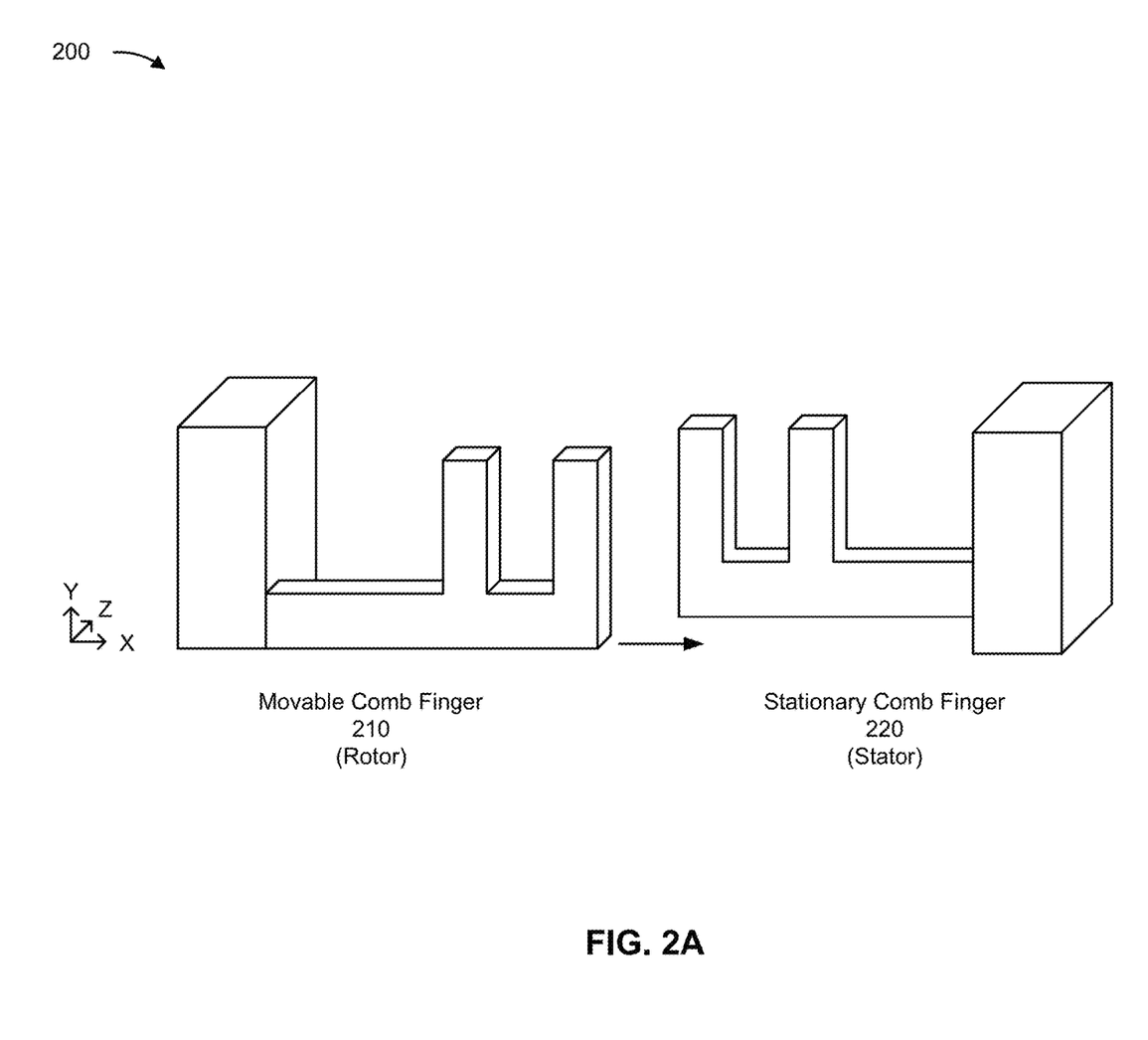
FIGS. 2A-2D are diagrams of an example of a comb finger of a rotor and a comb finger of a stator described herein.

FIGS. 2A-2D are diagrams of an example 200 of a comb finger of a rotor and a comb finger of a stator. As shown in FIG. 2A, example 200 includes a movable comb finger 210 (e.g., a comb finger of a rotor of a linear comb drive) and a stationary comb finger 220 (e.g., a comb finger of a stator of the linear comb drive). As further shown in FIG. 2A, movable comb finger 210 is configured to move linearly with respect to stationary comb finger 220. For example, movable comb finger 210 may move in the X direction, which is perpendicular to the YZ plane (e.g., in the direction of the complementary interleavable fingers of the movable comb finger 210 and the stationary comb finger 220).

Figure 2B:
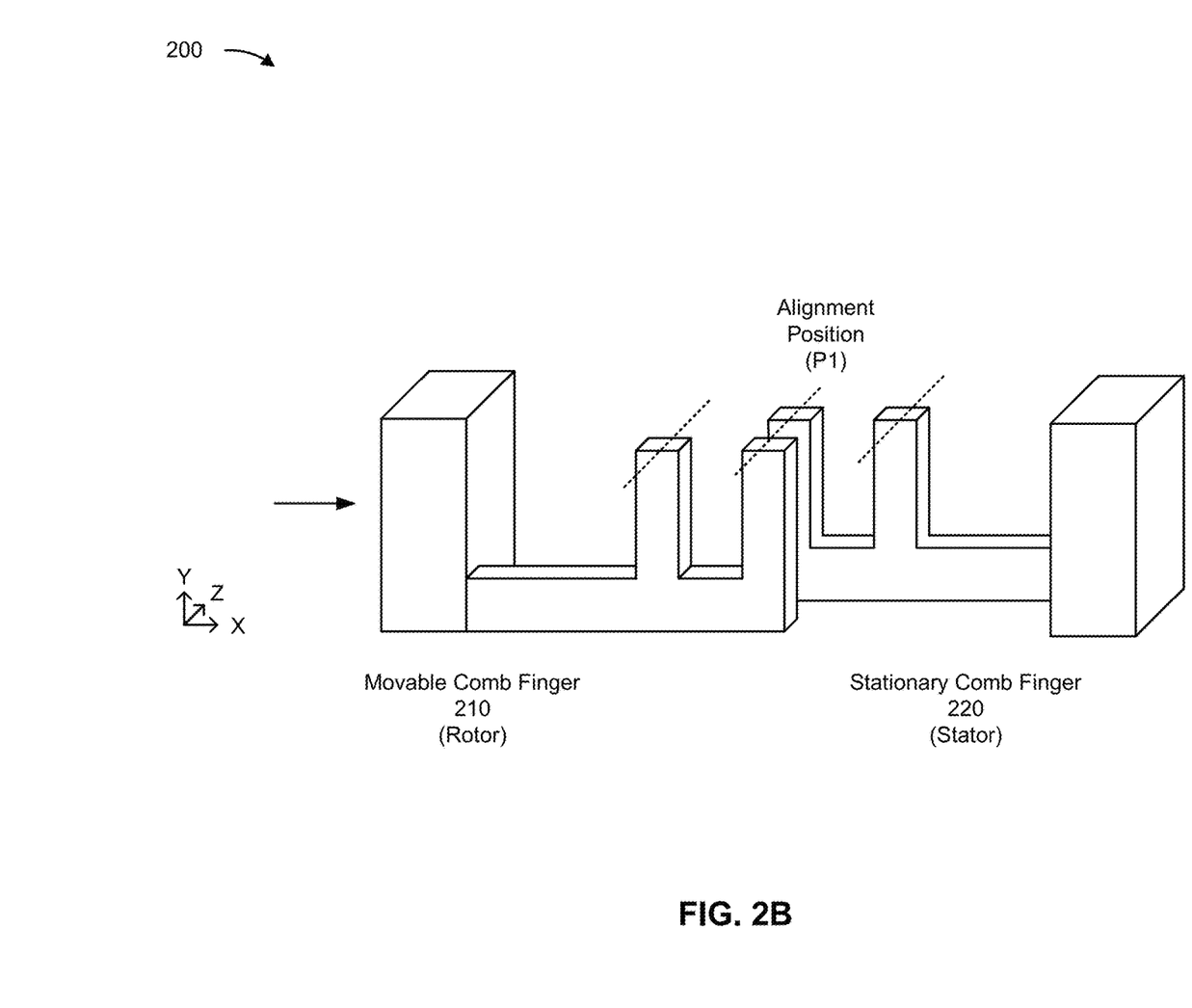
Figure 2C:
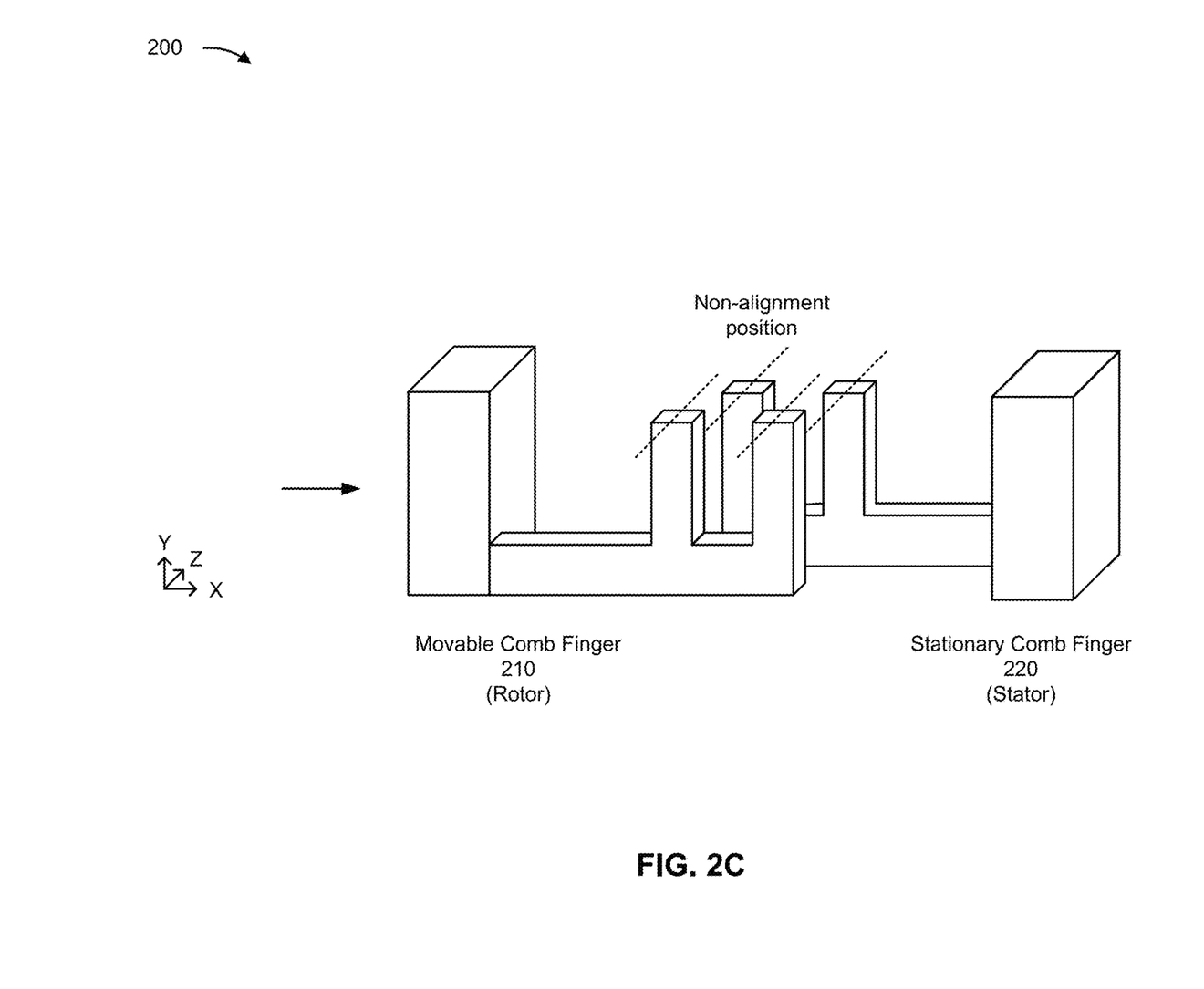
Figure 2D:
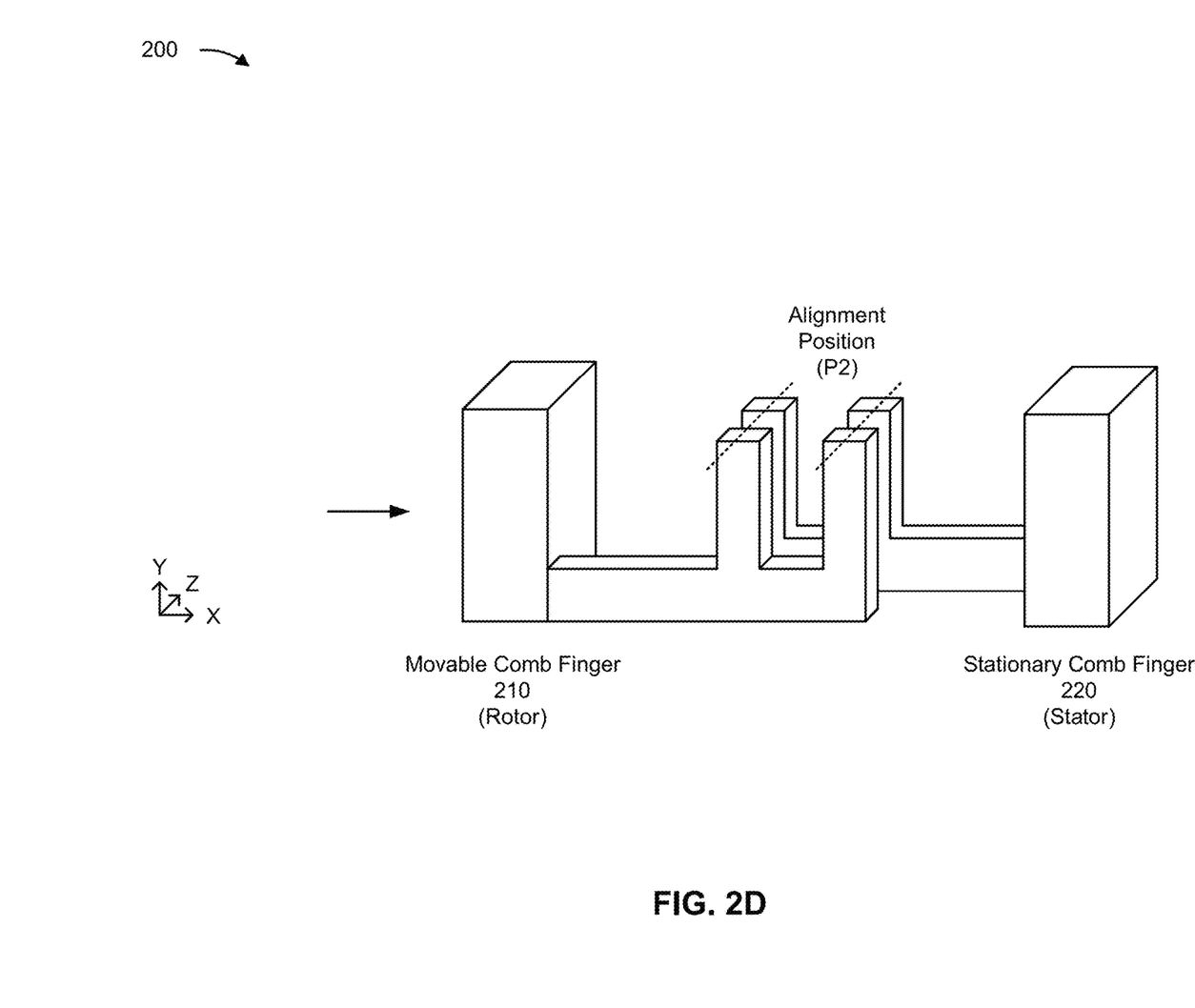

As shown in FIG. 2B, based on displacement of movable comb finger 210 in the X direction, respective prongs of movable comb finger 210 and stationary comb finger 220 may be aligned. In this position, a linear comb drive may achieve a relatively high level of alignment at alignment point P1. In contrast, as shown in FIG. 2C, when movable comb finger 210 is displaced further in the X direction, respective prongs of movable comb finger 210 and stationary comb finger 220 may not be aligned. In some implementations, a position of alignment between prongs of a movable comb finger 210 and a stationary comb finger 220 may be associated with a tolerance of less than or equal to a threshold percentage alignment of an optical path between, for example, two optical ports in an electro-optical system. As shown in FIG. 2D, based on movable comb finger 210 displacing even further in the X direction, respective prongs of movable comb finger 210 and stationary comb finger 220 become aligned again, at alignment position P2. In this way, a linear comb drive with tooth-shaped prongs on its comb fingers may have one or more discrete positions of alignment.

Although some implementations are shown herein in terms of a particular quantity of alignment positions (e.g., 1 alignment position, 2 alignment positions, 3 alignment positions, etc.), other quantities of alignment positions are contemplated. Moreover, although a linear comb drive may have a particular quantity of alignment positions, the linear comb drive may be configured to operate at only a subset of alignment positions. For example, a linear comb drive with 4 alignment positions may be used in a MEMS for which the linear comb drive actuates to only 3 alignment positions (e.g., for use in switching to 3 ports). Additionally, or alternatively, a linear comb drive with a set of alignment positions may also be used at non-alignment positions (e.g., with less stability than is achieved at the set of alignment positions).

Figure 2E:
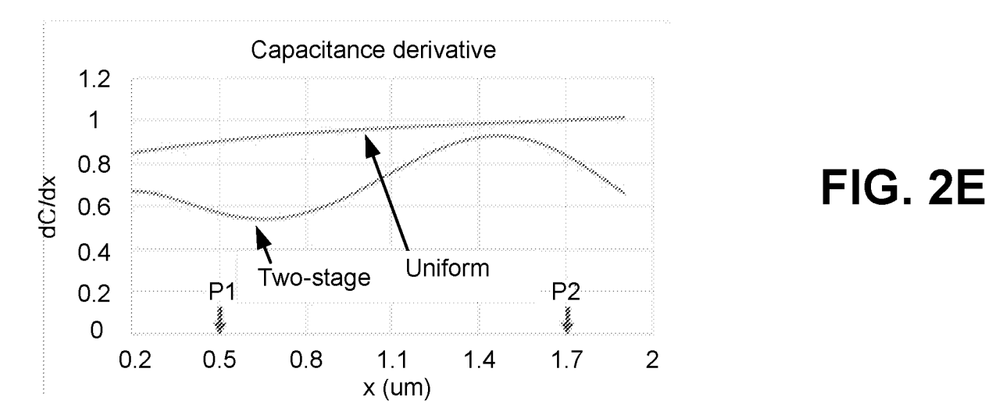
FIGS. 2E-2H are graphs of characteristics of the example of a comb finger of a rotor and a comb finger of a stator described herein.
Figure 2F:
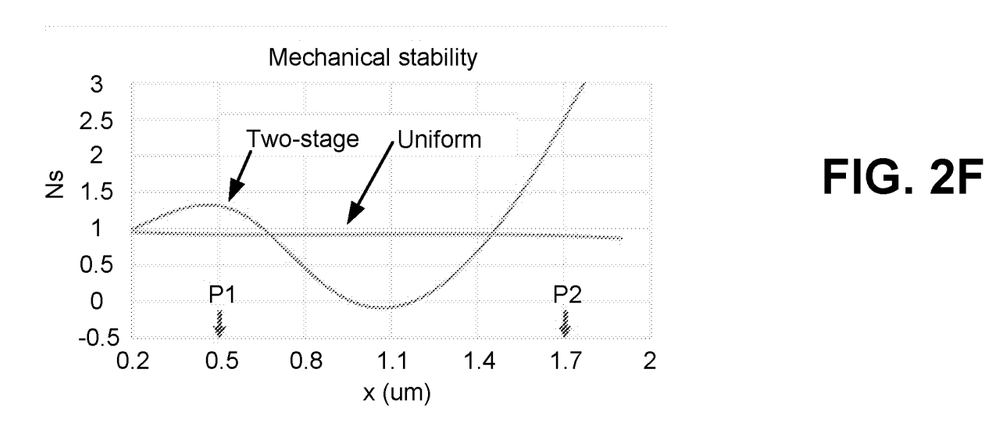

FIGS. 2E-2H show characteristics of a two-stage linear comb drive with tooth-shaped prongs, such as a linear comb drive including movable comb finger 210 and stationary comb finger 220. As shown in FIG. 2E, at the alignment positions P1 and P2, the two-stage linear comb drive has a negative capacitance derivative resulting, as shown in FIG. 2F, in an increased mechanical stability (e.g., a higher stability number) relative to a linear comb drive with uniform comb teeth (e.g., a linear comb drive with no prongs, which may be termed a uniform or a one-stage linear comb drive). While the uniform linear comb drive achieves a relatively constant mechanical stability at all possible positions, the two-stage linear comb drive achieves an approximately 40% improvement in mechanical stability at P1 and an approximately 270% stability improvement at P2. In this way, using a multi-stage linear comb drive enables improved mechanical stability for discrete alignment position applications.

Figure 2G:
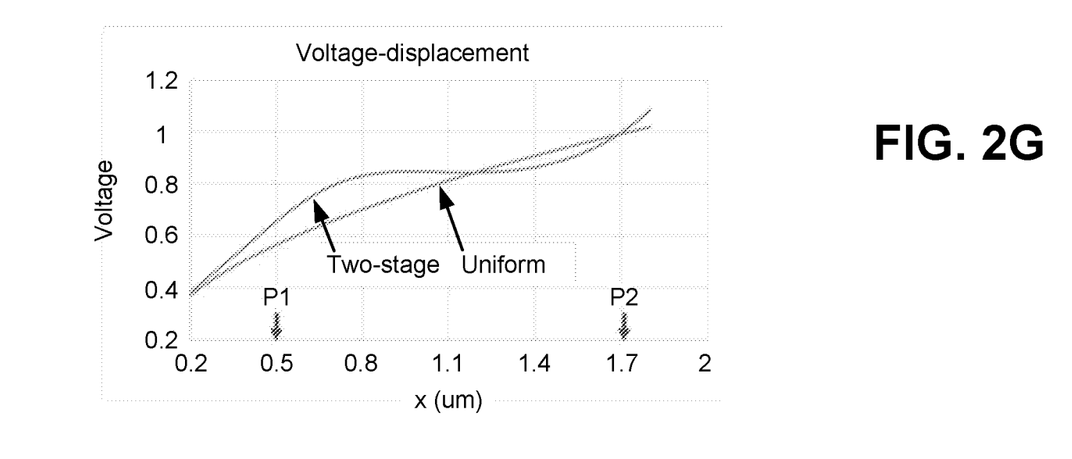
Figure 2H:
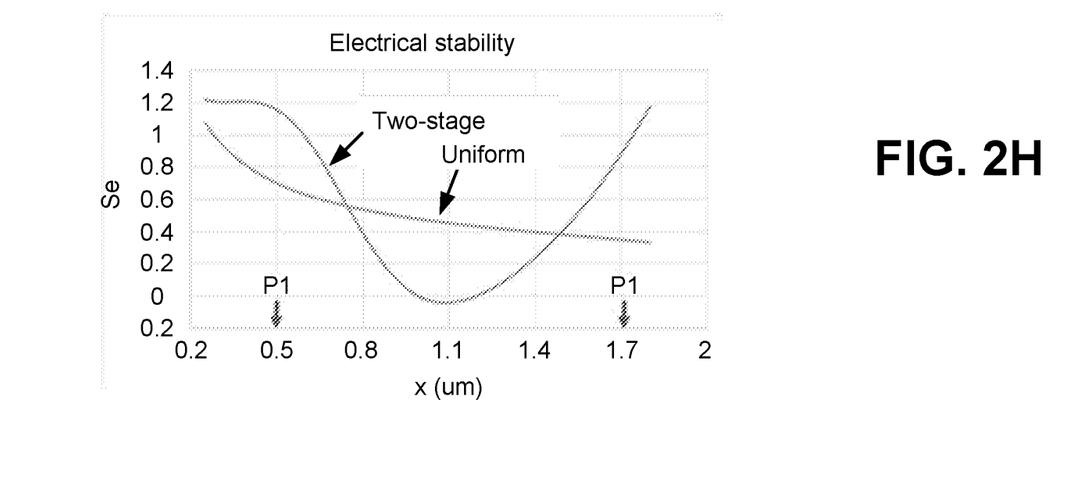

As shown in FIG. 2G, a derivative of the driving voltage is more positive for the two-stage linear comb than for the uniform linear comb at P1 and P2. As a result, as shown in FIG. 2H, the two-stage linear comb achieves a higher level of electrical stability at P1 and P2 than is achieved by the uniform linear comb. For example, the two-stage linear comb achieves a 65% increase in electrical stability and a 250% increase in electrical stability relative to the uniform linear comb at P1 and P2, respectively. In this way, using a multi-stage linear comb drive enables improved electrical stability for discrete alignment position applications.

As indicated above, FIGS. 2A-2H are provided as an example. Other examples may differ from what is described with regard to FIGS. 2A-2H. The number and arrangement of devices or components shown in FIGS. 2A-2D are provided as an example.

Figure 3:
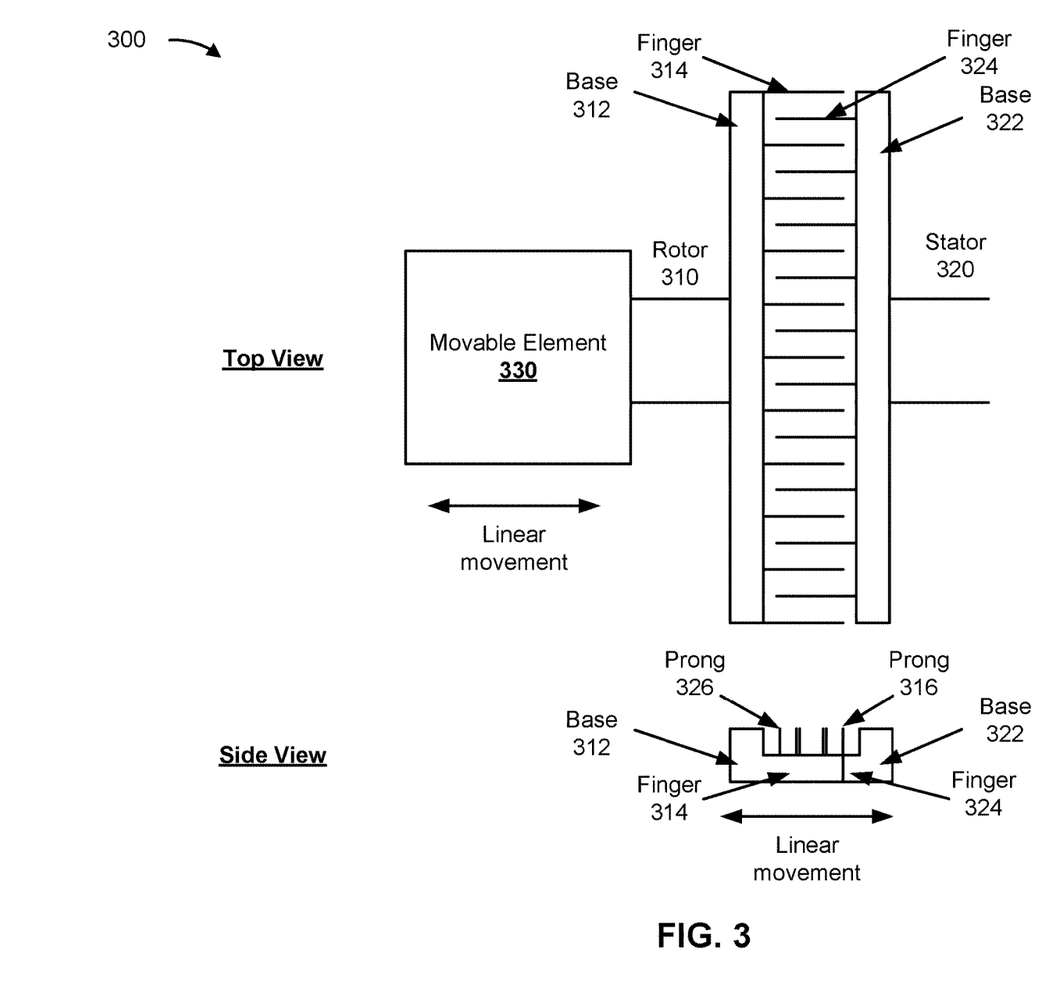
FIG. 3 is a diagram of an example of a micro-electro-mechanical system (MEMS) described herein.

FIG. 3 is a diagram of an example micro-electro-mechanical system (MEMS) 300. As shown in FIG. 3, MEMS 300 includes a rotor 310, a stator 320, and a movable element 330 attached to rotor 310. As further shown in FIG. 3, rotor 310 may include a base 312 with a set of fingers 314 (and each finger 314 may include one or more prongs 316) and stator 322 may include a base 322 with a set of fingers 324 (and each finger 324 may include one or more prongs 326).

As further shown in FIG. 3, in a top view and a side view, rotor 310 may move relative to stator 320. The rotor 310 and stator 320 may include conductive materials such that electro-static force can be used to generate linear movement between the rotor 310 and the stator 320. The rotor 310 and stator 320 should not touch for risk of electrical shorting. The rotor 310 may include a linear base 312 to which may be attached and extend a set of fingers 314. Each finger may include one or more prongs 316 which may extend in the plane of the finger such that the prongs 316 do not change the spacing between adjacent fingers 314. The stator 320 may have a similar structure, that is, the stator 320 may include a linear base 322 to which may be attached and extend a set of fingers 324 and each finger may include one or more prongs 326 which may extend in the plane of the finger such that the prongs 326 do not change the spacing between adjacent fingers 324.

The rotor 310 and the stator 320 may be in a complimentary configuration such that the fingers 314 and 324 may be interleaved (e.g., to enhance electro-static forces between the rotor 310 and the stator 320) and the prongs 316, 326 may be brought into or out of alignment through linear movement of the rotor 310 relative to the stator 320. The fingers 314 and 324 may be equally spaced and may be complementary (e.g., in shape, size, orientation, and/or the like).

Movement of the rotor 310 relative to stator 320 may displace movable element 330 between a set of discrete positions defined by prongs 350 of comb fingers 240 of rotor 310 and/or stator 320. In this way, a linear comb drive of MEMS 300 may enable alignment of movable element 330 at the set of discrete positions. In some implementations, movable element 330 may be a particular type of electrical element, optical element, electro-optical element, and/or the like. For example, movable element 330 may be a mirror, a waveguide, a prism, a grating, an optical transmitter, an optical receiver, a MEMS device, an optical MEMS device, and/or the like. In some implementations, MEMS 300 may be included in an electro-optical device. For example, MEMS 300 may be included in an optical switching device that includes a set of optical ports alignable (e.g., on an optical path) to movable element 330 when movable element 330 is actuated, by MEMS 300, to the set of discrete positions. In this case, a pitch between the prongs and/or between the set of discrete positions may correspond to a pitch between ports of the set of optical ports.

As indicated above, FIG. 3 is provided as an example. Other examples may differ from what is described with regard to FIG. 3. The number and arrangement of devices shown in FIG. 3 are provided as an example. In practice, there may be additional devices, fewer devices, different devices, or differently arranged devices than those shown in FIG. 3.

FIGS. 4A-4G are diagrams of examples 400-460 of tooth-shaped comb finger shapes. For example, FIG. 4A includes an example 400 of a single prong on a comb finger. In contrast, FIG. 4B includes an example 410 of a set of two prongs on a comb finger. In this case, each prong of example 410 is associated with the same height, h. In contrast, FIG. 4C includes an example 420 of a first prong and a second prong on a comb finger with different heights, h1, and h2, respectively. Similarly, FIG. 4D includes an example 430 of a set of three prongs with differing pitches. For example, a first prong and a second prong may have a first pitch, p1, and the second prong and a third prong may have a second pitch, p2.

Figure 4A:
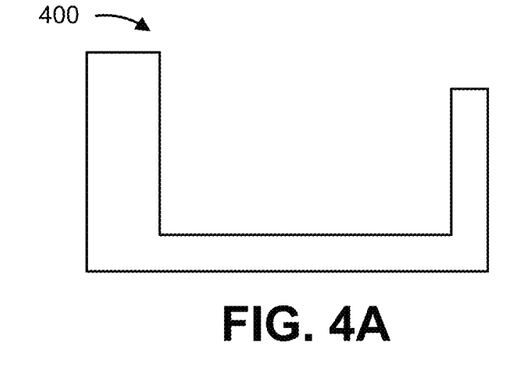
FIGS. 4A-4G are diagrams of examples of tooth-shape comb finger shapes described herein
Figure 4B:
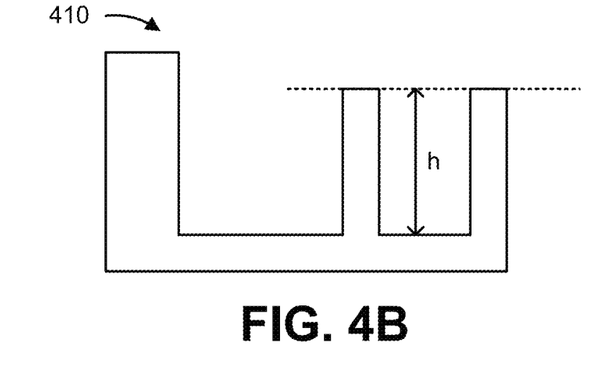
Figure 4C:
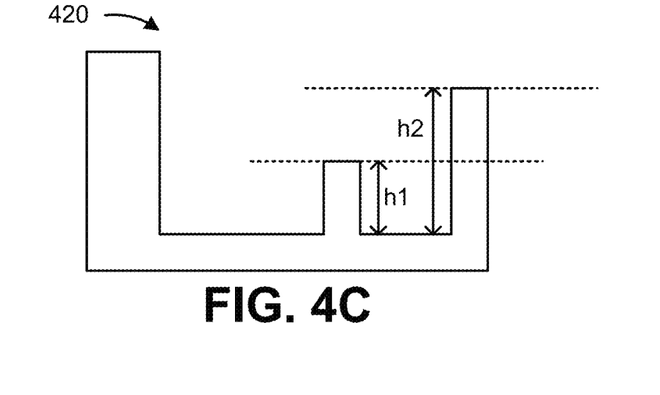
Figure 4D:
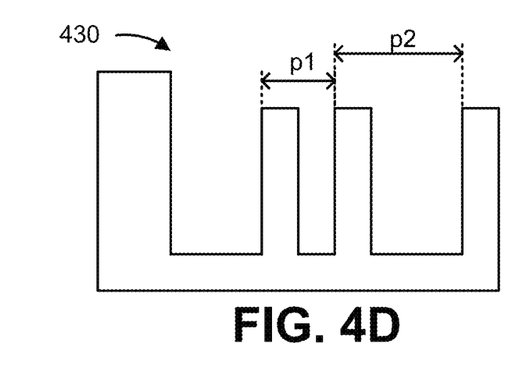
Figure 4E:
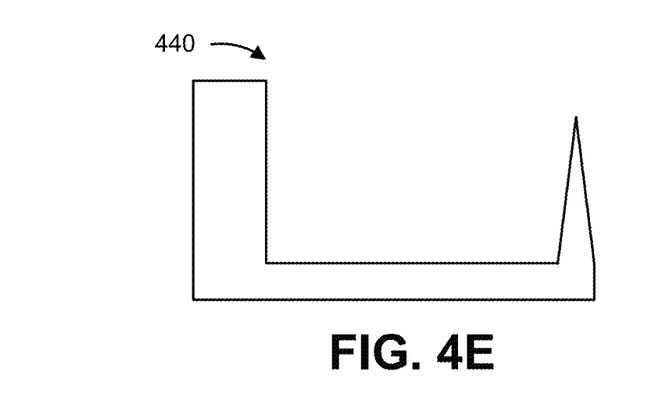
Figure 4F:
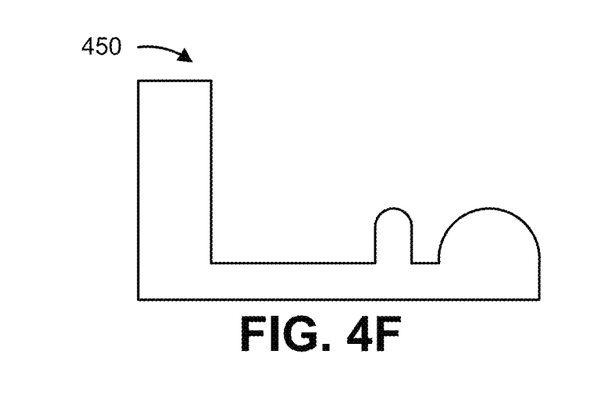
Figure 4G:
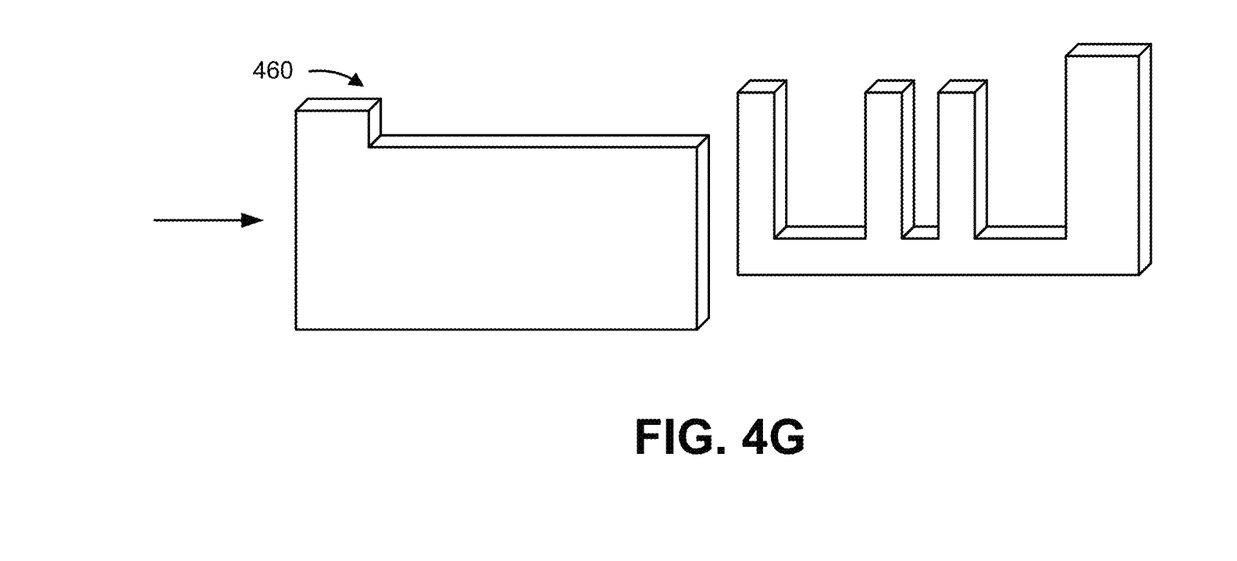

FIG. 4E includes an example 440 of a prong having a tooth-shape that is a non-rectangular profile. For example, in a first plane, as shown, the tooth-shape may be a triangular profile, as shown in FIG. 4E; a circular profile, as shown in FIG. 4F and by example 450 (e.g., which includes a circular profile and a circular topped pillar profile); and/or the like. In some implementations, multiple prongs in a linear comb drive may have multiple different shapes in one or more planes. In some implementations, different tooth-shapes of prongs in a rotor 310 may correspond to different tooth-shapes of prongs in a stator 320 to provide different alignment stability. Using FIG. 4F as an example rotor finger, an identical stator finger may not allow both prongs to align with their counterparts; however, a complementary stator finger (e.g., a stator finger with prongs in the opposite order of the rotor finger) could allow both prongs to align with their counterparts. An alignment of one or more rotor prongs and one or more stator prongs having non-complementary tooth-shapes may or may not be a desired alignment position. FIG. 4G includes an example 460 of a linear comb drive that includes a combination of a multi-stage profile and a uniform-stage profile. For example, one of a stator or a rotor may have a uniform profile and the other of the stator or the rotor may have a non-uniform profile to achieve improved stability at discrete positions of the linear comb drive relative to a linear comb drive with only a uniform-stage profile.

As indicated above, FIGS. 4A-4G are provided as an example. Other examples may differ from what is described with regard to FIGS. 4A-4G. The number and arrangement of devices or components shown in FIGS. 4A-4G are provided as an example.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A linear comb driver, comprising:
a stator; and
a rotor,
wherein at least one of the stator or the rotor includes a comb with one or more horizontally-extending fingers that have a tooth-shape formed by one or more prongs that extend vertically from the one or more horizontally-extending fingers in a plane formed by the one or more horizontally-extending fingers,
wherein the one or more prongs include a first set of prongs attached to the stator via at least one finger of the one or more horizontally-extending fingers,
wherein the one or more prongs include a second set of prongs attached to the rotor via at least one other finger of the one or more horizontally-extending fingers, and
wherein the rotor is configured to be linearly displaced relative to the stator.

2. The linear comb driver of claim 1, further comprising:
a movable element attached to the rotor.

3. The linear comb driver of claim 2, wherein the tooth-shape is configured to provide, for the linear comb driver, a higher stability number for the movable element at a first one or more positions than at a second one or more positions.

4. The linear comb driver of claim 3, wherein the first one or more positions are defined by an alignment of the one or more prongs to another one or more prongs of the stator or the rotor and the second one or more positions are defined by a lack of alignment of the one or more prongs to the other one or more prongs.

5. A comb driver finger assembly, comprising:
a base element;
a finger element attached to the base element and extending in a first direction; and
at least one prong element attached to the finger element and extending in a plane of the finger element and in a second direction perpendicular to the first direction,
the at least one prong element including a first set of prong elements attached to a stator via the finger element, configured to be aligned with a second set of prong elements attached to a rotor via another finger element;
wherein the comb driver finger assembly is configured to be linearly displaced along the first direction.

6. The comb driver finger assembly of claim 5, wherein the comb driver finger assembly comprises a plurality of finger elements, and
wherein each of the plurality of finger elements comprises a single prong.

7. The comb driver finger assembly of claim 5, wherein the first set of prongs comprises a plurality of prongs disposed at different distances along the finger element in the first direction and separated by a threshold distance in the first direction.

8. The comb driver finger assembly of claim 5, wherein the at least one prong element is associated with a rectangular shape.

9. The comb driver finger assembly of claim 5, wherein the at least one prong element is associated with a non-rectangular shape.

10. The comb driver finger assembly of claim 5,
wherein a first prong element, of the first set of prong elements, is associated with a first shape and a second prong element, of the first set of prong elements, is associated with a second shape.

11. The comb driver finger assembly of claim 5,
wherein a first prong element, of the first set of prong elements, is associated with a first height in the second direction and a second prong element, of the first set of prong elements, is associated with a second height in the second direction.

12. A micro-electro-mechanical device, comprising:
a stator comb including a first one or more fingers,
wherein at least one of the first one or more fingers is associated with a first tooth-shape formed by a first one or more prongs, and
wherein the first one or more prongs extend from the first one or more fingers in a first plane formed by the first one or more fingers,
a rotor comb including a second one or more fingers,
wherein at least one of the second one or more fingers is associated with a second tooth-shape formed by a second one or more prongs,
wherein the second one or more prongs extend from the second one or more fingers in a second plane formed by the second one or more fingers,
wherein the first one or more fingers are configured to interleave with the second one or more fingers, and
wherein the rotor comb is configured to be linearly displaced relative to the stator comb; and
a movable element mounted to the rotor comb.

13. The micro-electro-mechanical device of claim 12, wherein the first tooth-shape includes a first one or more peaks formed by the first one or more prongs and a first one or more valleys adjacent to the first one or more peaks formed by the first one or more prongs; and
wherein the second tooth-shape includes a second one or more peaks formed by the second one or more prongs and a second one or more valleys adjacent to the second one or more peaks formed by the second one or more prongs.

14. The micro-electro-mechanical device of claim 12, wherein the first tooth-shape and the second tooth-shape are configured to provide, for the micro-electro-mechanical device, a higher stability number for the movable element at a first one or more positions than at a second one or more positions,
wherein the first one or more positions are defined by an alignment of the first one or more prongs to the second one or more prongs, and the second one or more positions are defined by a lack of alignment of the first one or more prongs to the second one or more prongs.

15. The micro-electro-mechanical device of claim 14, wherein a capacitance derivative of the first one or more prongs and the second one or more prongs is a first value at a particular position of the first one or more positions and the capacitance derivative of the first one or more prongs and the second one or more prongs is a second value at a particular position of the second one or more positions, and
wherein the first value is greater than the second value.

16. The micro-electro-mechanical device of claim 14, wherein a voltage derivative of the first one or more prongs and the second one or more prongs is a first value at a particular position of the first one or more positions, and the voltage derivative of the first one or more prongs and the second one or more prongs is a second value at a particular position of the second one or more positions, and
wherein the first value is greater than the second value.

17. The micro-electro-mechanical device of claim 14, further comprising:
a set of optical ports alignable to the movable element, and wherein a pitch between positions of the first one or more positions corresponds to a pitch between ports of the set of optical ports.

18. The micro-electro-mechanical device of claim 14, wherein the first one or more prongs include a first quantity of prongs and the second one or more prongs include a second quantity of prongs, and
wherein the first quantity and the second quantity are a common quantity.

19. The micro-electro-mechanical device of claim 12, wherein the movable element is at least one of:
a mirror,
a waveguide,
a prism,
a grating,
an optical transmitter,
an optical receiver,
another micro-electro-mechanical device, or
an optical micro-electro-mechanical device.

\* \* \* \* \*